United States Patent [19]

Hanawa

[11] Patent Number: 4,737,714

[45] Date of Patent: Apr. 12, 1988

[54] MAGNETIC RESONANCE SPECTROSCOPY

[75] Inventor: Masatoshi Hanawa, Otawara, Japan

[73] Assignee: Kabushiki Kaisha Toshiba, Kawasaki, Japan

[21] Appl. No.: 64,702

[22] Filed: Jun. 22, 1987

[30] Foreign Application Priority Data

Aug. 13, 1986 [JP] Japan .................. 61-190777

[51] Int. Cl.$^4$ ............................................ G01R 33/20
[52] U.S. Cl. .................................... 324/309; 324/307
[58] Field of Search ............... 324/300, 306, 307, 308, 324/309, 310, 312, 313, 314; 128/653

[56] References Cited

U.S. PATENT DOCUMENTS

| 4,319,190 | 3/1982 | Brown | 324/309 |
| 4,480,228 | 10/1984 | Bottomley | 324/309 |
| 4,689,563 | 8/1987 | Bottomley | 324/309 |
| 4,689,564 | 8/1987 | Leue et al. | 324/309 |
| 4,694,250 | 9/1987 | Iwaoka | 324/309 |
| 4,698,592 | 10/1987 | Feinberg | 324/309 |

Primary Examiner—Michael J. Tokar
Attorney, Agent, or Firm—Schwartz, Jeffery, Schwaab, Mack, Blumenthal & Evans

[57] ABSTRACT

A magnetic resonance spectroscopic system for receiving a magnetic resonance signal from a localized area in a certain slice in a sample and obtaining a frequency spectrum of the magnetic resonance signal based on the received signal, includes control means for selectively exciting regions sandwiching a zone containing said localized area in one of x- and y-axis directions in said slice, thereafter applying a spoiler to eliminate lateral spin components from said regions, selectively exciting regions sandwiching a zone containing said localized area in the other of x- and y-axis directions in said slice, thereafter applying a spoiler to eliminate lateral spin components from said last-mentioned regions, and then exciting a zone containing said localized area in a $z_y$-axis direction to extract a magnetic resonance signal of said localized area. The magnetic resonance spectroscopic system is of a simple arrangement capable of facilitating measurements and producing a magnetic resonance signal of a localized area located at a desired depth in the sample under examination.

5 Claims, 5 Drawing Sheets

MAGNETIC RESONANCE SPECTROSCOPY

BACKGROUND OF THE INVENTION

The present invention relates to a magnetic resonance spectroscopic system for measuring information such as the spin density, chemical shift, etc., of certain atomic nuclei present in an object under examination based on magnetic resonance (MR).

Conventional magnetic resonance spectroscopic systems obtain the sectional image of a desired planar slice S in a sample P under examination as shown in FIG. 8 of the accompanying drawings. There has been an increasing demand for extracting an MR signal of only a localized area or volume (such as a cardiac muscle, an arm muscle, a leg muscle, or the like) in the slice S, and obtaining the frequency spectrum of a resonance signal by way of magnetic resonance spectroscopy for medical diagnosis.

There are known two methods, described below, for extracting an MR signal of only such a localized volume.

One method is known as localized nuclear magnetic resonance spectroscopy as disclosed in U.S. Pat. No. 4,480,228. According to this method, as shown in FIG. 9 of the accompanying drawings, a localized uniform field Bo' is produced in a static magnetic field Bo, and magnetic resonance is caused only in that localized uniform field Bo' to detect an MR signal. With this method, however, it is necessary to vary a coil current range in order to change the distribution of the static field. Moreover, the arrangement is complex and the measuring process is tedious and time-consuming since the sample must be varied in position.

The other method is known as a surface coil method. A surface coil is disposed on the surface of a target region of a sample or object to be examined, and a signal as shown in FIG. 10 is obtained from the surface coil. Then, only an intensive MR signal in an area including a central portion D1 of the obtained signal at a depth in the direction D is extracted and used as an MR signal of a localized area or volume. This method is effective in receiving a signal from the surface of the sample and its neighboring area. However, since signals from deeper areas are weak in intensity, no sufficient MR signal can be obtained from such deeper areas.

SUMMARY OF THE INVENTION

In view of the aforesaid shortcomings of the conventional magnetic resonance spectroscopy, it is an object of the present invention to provide a magnetic resonance spectroscopic system of a simple arrangement capable of easy measurements.

Another object of the present invention is to provide a magnetic resonance spectroscopic system capable of extracting an MR signal from a desired localized area or volume located at a depth in a sample or object under examination.

According to the present invention, the above objects can be achieved by a magnetic resonance spectroscopic system for receiving a magnetic resonance signal from a localized area in a certain slice in a sample and obtaining a frequency spectrum of the magnetic resonance signal based on the received signal, said system comprising control means for selectively exciting regions sandwiching a zone containing said localized area in one of x- and y-axis directions in said slice, thereafter applying a spoiler to eliminate lateral spin components from said regions, selectively exciting regions sandwiching a zone containing said localized area in the other of x- and y-axis directions in said slice, thereafter applying a spoiler to eliminate lateral spin components from said last-mentioned regions, and then exciting a zone containing said localized area in a $z_r$-axis direction to extract a magnetic resonance signal of said localized area.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
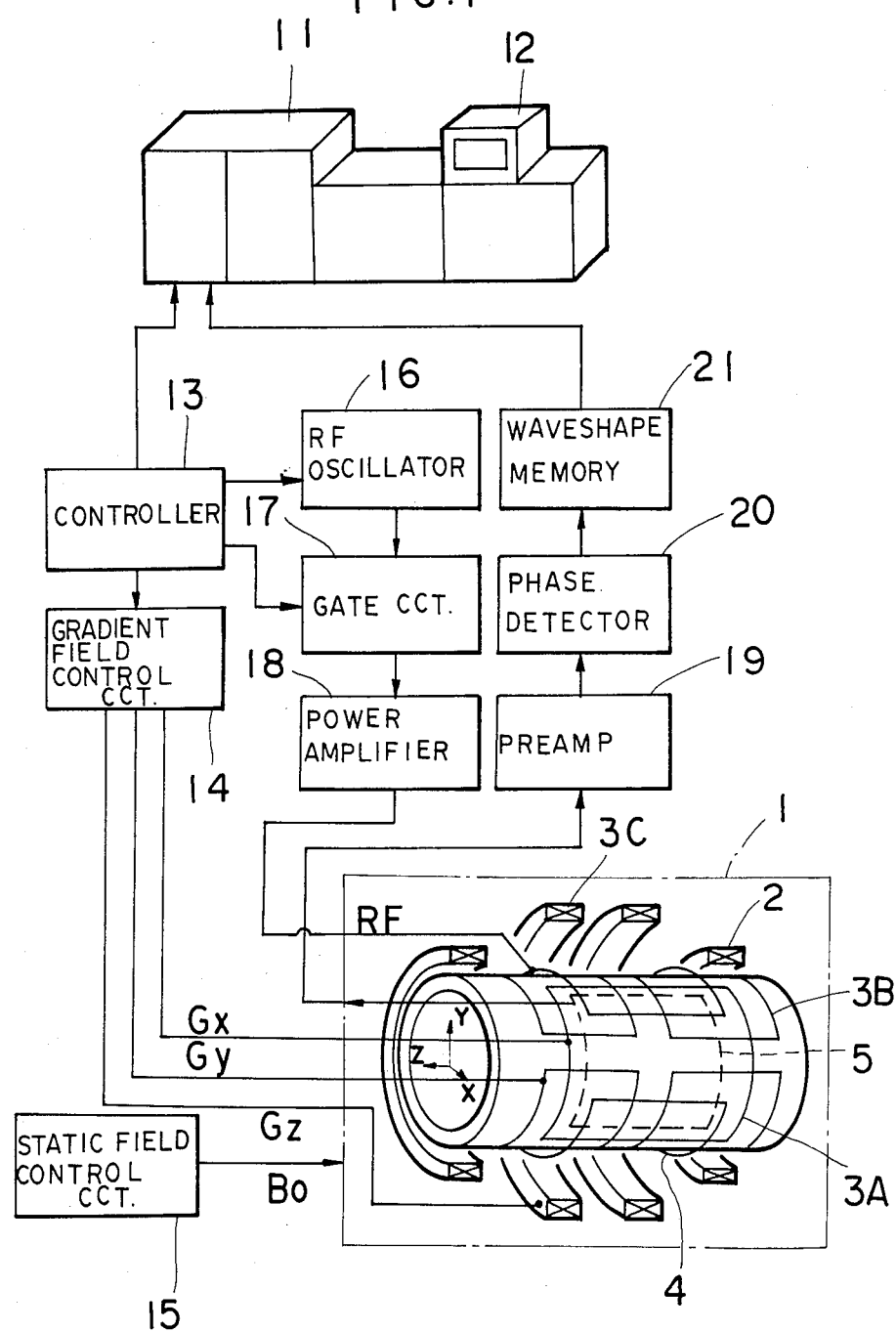
FIG. 1 is a block diagram of a magnetic resonance spectroscopic system according to the present invention.
Figure 2:
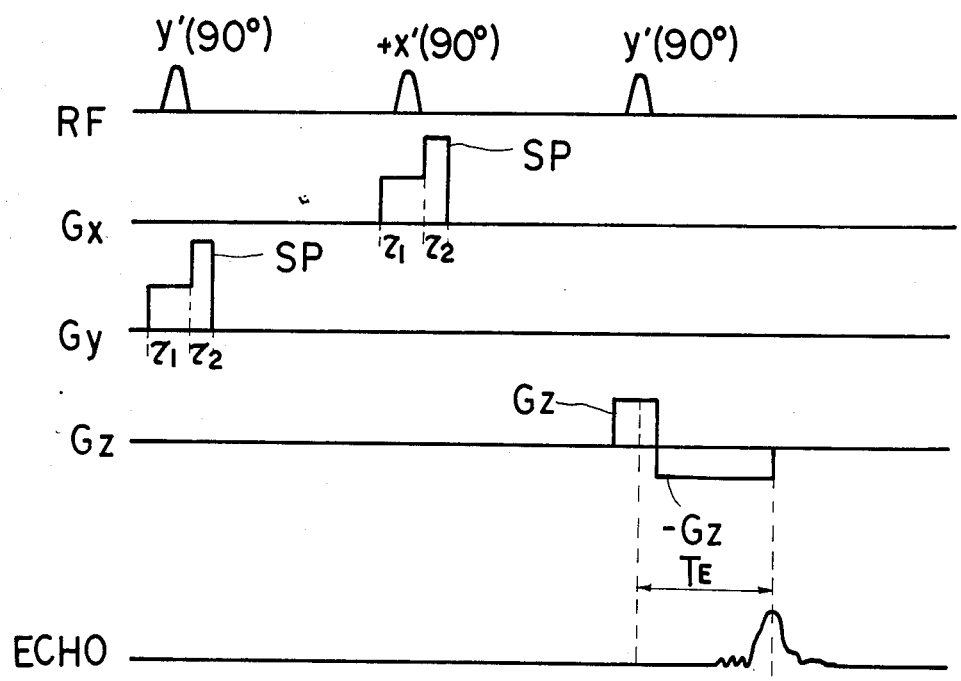
FIG. 2 is a timing chart showing a pulse sequence produced by the magnetic resonance spectroscopic system shown in FIG. 1.
Figure 3:
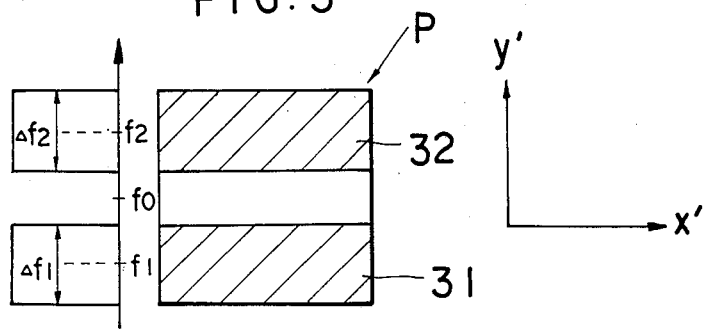
FIGS. 3 through 5 show scanning formats explaning operation of the magnetic resonance spectroscopic system.
Figure 4:
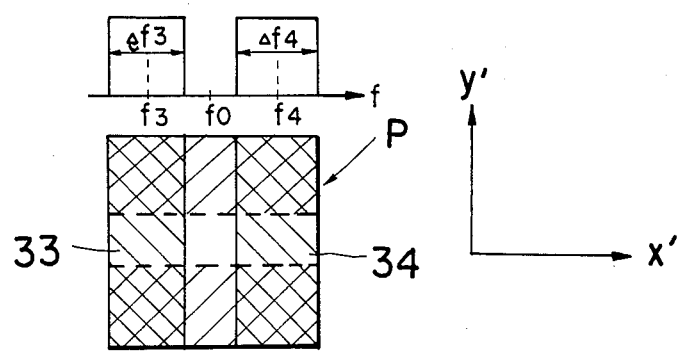

FIG. 1 shows in block form a magnetic resonance spectroscopic system according to the present invention.

A magnet assembly 1 comprises a static magnetic field coil 2 for applying a main field Bo of a constant intensity to a sample or object inserted in the magnet assembly 1, gradient coils 3A, 3B, 3C for applying gradient fields in x, y, and z directions to the sample, an RF transmitting coil 4 for applying RF pulses to the sample to excite spins of atomic nuclei in the sample, and a receiver coil 5 for detecting a resonance signal from the sample. A processor unit 11 is connected to a display unit 12 and a controller 13.

The controller 13 is coupled to a gradient field control circuit 14, an RF oscillator 16, and a gate circuit 17. The gradient field control circuit 14 produces gradient field control signals Gx, Gy, Gz which are applied to the respective gradient coils 3A, 3B, 3C of the magnet assembly 1. The RF oscillator 16 is connected to the gate circuit 17, which is connected to a power amplifier 18. The power amplifier 18 ampifies an RF signal from the gate circuit 17 and applies the amplified RF signal to the RF transmitting coil 4 of the magnet assembly 1. A signal produced by the receiver coil 5 is applied to a preamplifier 19 which applies an output signal to a phase detector 20. The output signal from the phase detector 20 is sent to a waveshape memory 21. The output signal from the waveshape memory 21 and the output signal from the controller 13 are supplied to the processor unit 11.

The controller 13 generates a timing signal for collecting observation data of an MR signal and controls operation of the gradient field control circuit 14 and the gate circuit 17 for thereby controlling the gradient fields Gx, Gy, Gz and a sequence in which the RF pulses are generated.

The gradient field control circuit 14 controls currents flowing through the gradient coils 3A, 3B, 3C to apply gradient fields to the sample under study.

A static field control circuit 15 controls a current supplied to the static field coil 2 to apply a static magnetic field Bo to the sample.

The RF oscillator 16 generates an RF signal with its frequency controlled by the controller 13. The gate circuit 17 is responsive to the timing signal from the controller 13 for modulating the RF signal from the RF oscillator 16 to produce RF pulses. The power amplifier 18 amplifies the RF pulses generated by the gate circuit 17 and supplies them to the RF transmitting coil 4.

The preamplifier 19 amplifies an MR signal from the receiver coil 5. The phase detector 20 detects the phase of the amplified MR signal from the preamplifier 19. The waveshape memory 21 stores a waveshape signal as phasedetected.

The processor unit 11 controls operation of the controller 13, receives timing information from the controller 13, reads a stored signal out of the waveshape memory 21, and processes signals based on observed magnetic resonance. The processor unit 11 also displays an operation command on the display unit 12 for the operator.

The RF signal has a central frequency f1 of a localized area or volume and different frequencies f1, f2, f3, f4 on both sides of the central frequency f1. These frequencies are selected by the controller 13 and their bands are controlled by the gate circuit 17.

The gradient field signals Gx, Gy are of such a signal pattern that it has a prescribed intensity level for a certain time interval and thereafter jumps to a higher intensity level (spoiler).

Operation of the magnetic resosnance spectroscopic system shown in FIG. 1 will be described with reference to FIGS. 2 through 5.

In order to produce a sectional image in a particular position in a sample under study, a current is passed through the static field coil 2 by the static field control circuit 15 to generate a static magnetic field which is uniform in the z-axis direction (FIG. 1) for thereby orienting spins in the z-axis direction. Then a signal is added to specify the direction of spins and a slice position. A rotating coordinate system x′, y′, z will be referred to in the following description:

Selective excitation pulses RF are applied in order to turn over spins 90° in a −x′ direction in the rotating coordinate system. At the same time, a slicing gradient field Gy is applied in the y-axis direction. The selective excitation pulses RF contain two carriers f1, f2 of different frequencies. More specifically, assuming that a desired localized area is present centrally in a sample or object P under study, and if a central frequency for exciting a zone containing the localized area is f0, then RF pulses should contain two frequencies f1, f2 for selecting regions 31, 32 (hatched in FIG. 3) sandwiching the exited zone. Both of f1, f2 indicated central frequencies, and the widths of the regions 31, 32 are determined by Δf1, Δf2. Use of different frequencies to select a desired region can readily be understood from the following equation (1):

$$f0 = \gamma/2\pi \cdot Bo \qquad (1)$$

where $\gamma$ is the magnetic rotation ratio.

The gradient field Gy is such that after a slicing field having a normal intensity level has been applied for a time period τ1 for slicing the desired region, a magnetic field of a higher intensity level is applied for a time period τ2. The magnetic field of higher intensity is referred to as a spoiler SP (spoiling magnetic field for dephasing the spins). When the spoiler SP is applied, lateral spin components are scattered and eliminated. That is, the lateral spin components are scattered by the gradient field Gy, and such scattering is quickly effected by the spoiler so that the lateral spin components are eliminated.

The slice thicknesses Δt1, Δt2 of the regions 31, 32 in the y direction are determined by the equations (2) and (3) as follows:

$$\Delta t1 = \Delta f1/\gamma Gy \qquad (2)$$

$$\Delta t2 = \Delta f2/\gamma Gy \qquad (3)$$

Excitation of laterally spaced regions 33, 34 (shown in FIG. 4) based on the same principles as described above will be described below. 90° RF pulses are applied in the x′ direction in order to turn over spins 90° in the y′ direction in the rotating coordinate system. At the same time, a slicing gradient field Gs is applied. The RF pulses used contain two carriers f3, f4 of different frequencies (having bands Δf3, Δf4, respectively) sandwiching the central frequency f0 containing a target area in the same manner as described above. The gradient field Gx has a normal slicing field intensity level during a front interval τ1 and a higher intensity level during a rear interval τ2 (spoiler SP). Therefore, the lateral spin components of the regions 33, 34 once excited are eventually eliminated.

Figure 5:
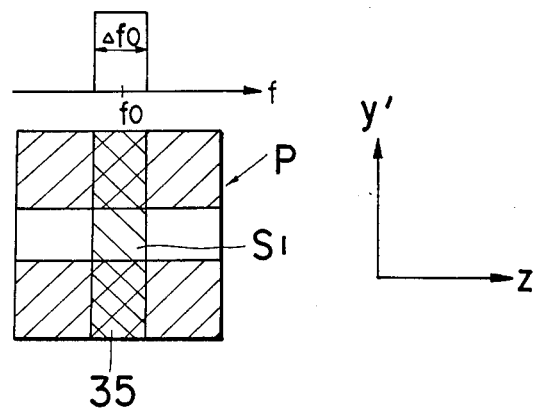

Finally, as illustrated in FIG. 5, upon elapse of a prescribed interval of time, 90° RF pulses containing the central frequency f0 (having a band Δf0) are applied along the y-axis to excite a central region 35, and a gradient field $Gz_y$ is applied. Subsequently, a re-imaging gradient field $-Gz_y$ is applied thereby to produce an echo signal. More specifically, the spins are rotated in the opposite direction by a gradient field −Gz to reach saturation, and an echo is produced upon elapse of an echo time TE after the gradient field Gz has been applied. At this time, since the spin components in the other regions have been eliminated in the preceding process, only data in the localized area S1 can be obtained.

The data is obtained by the receiver coil 5 and transmitted through the preamplifier 19 to the phase detector 20 in which the spectrum of the data is analyzed. Thereafter, an image is reconstructed by the processor unit 11 and displayed, if necessary, on the display unit 12.

Data of a localized area or volume having a desired thickness and located in a sample at a desired depth can easily be collected in the above manner.

Figure 6:
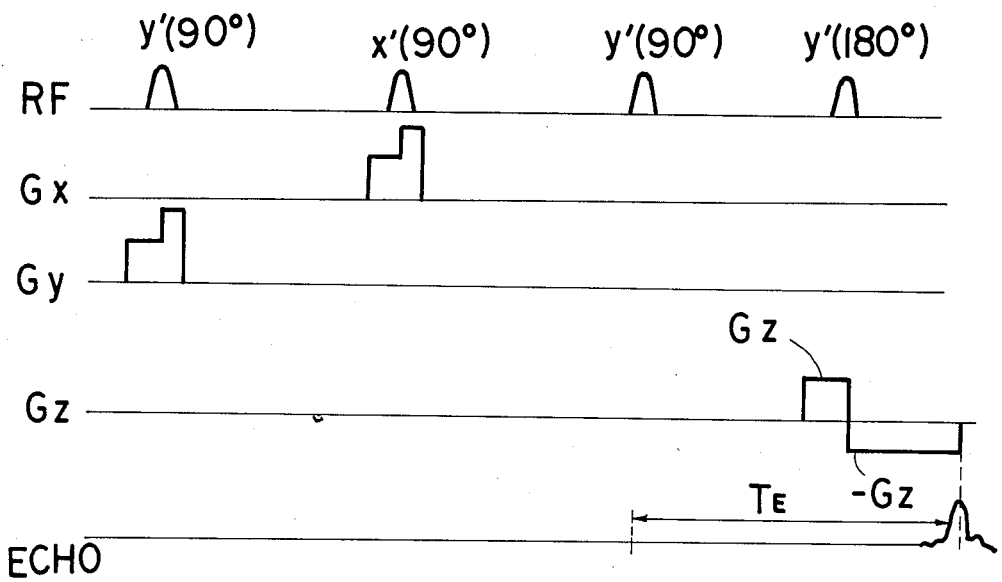
FIGS. 6 and 7 are timing charts of other pulse sequences of the present invention.

With the system of the present invention, only 90° RF pulses are employed, but no 180° RF pulses are used. Thus, the pulse sequence is simplified. In addition, where nuclei (such as $^{31}$P, Na, for example) having a short spin-spin relaxation T2 are to be observed, the signal can be obtained without deteriorating the S/N ratio. For those having a long spin-spin relaxation T2, however, 180° RF pulses may be applied and thereafter an echo may be collected as shown in FIG. 6. In this case, the signal is attenuated since the echo collecting time TE is long.

Figure 7:
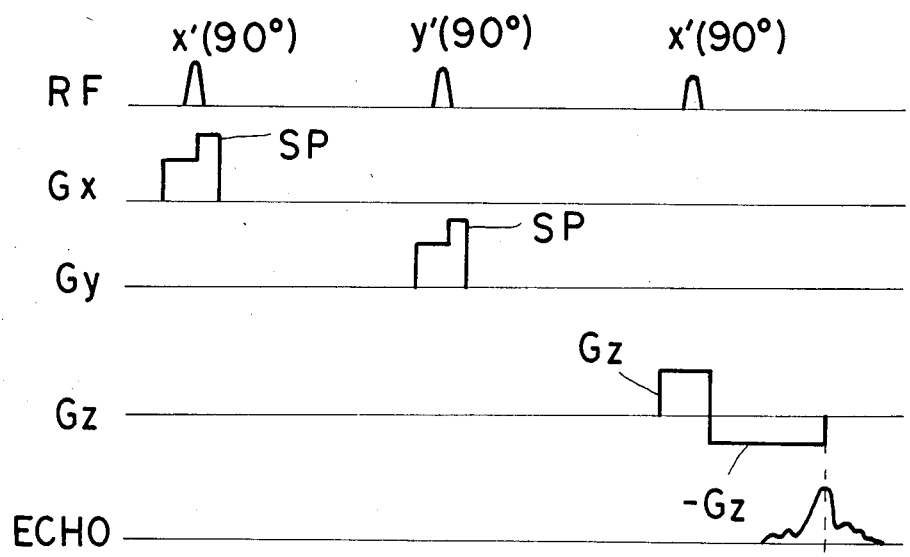
Figure 8:
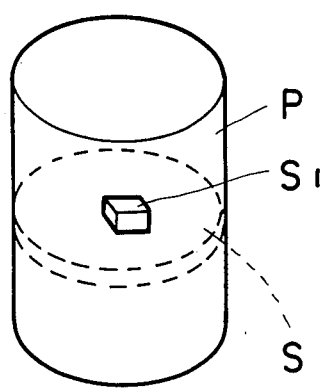
FIG. 8 is a view explanatory of the manner in which a signal is obtained from a localized area or volume in a sample under examination.
Figure 9:
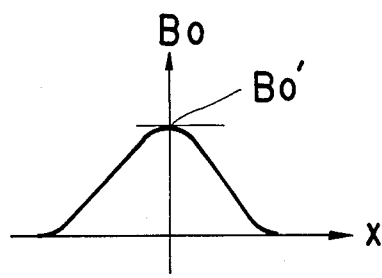
FIG. 9 is a diagram showing a conventional localized spectroscopic method.
Figure 10:
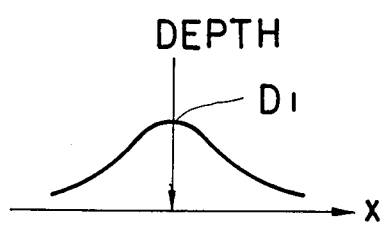
FIG. 10 is a diagram showing a conventional surface coil method.

In the above embodiment, the target region is first sliced in the y' direction, and then sliced in the x' direction. However, as shown in FIG. 7, the target region may first be sliced in the x' direction, and then sliced in the y' direction.

While the localized area or volume is assumed to be centrally located in the slice and its central frequency is selected to be f0, an off-center area may be selected as a localized area and its central frequency may accordingly be varied.

Although a certain preferred embodiment has been shown and described, it should be understood that many changes and modifications may be made therein without departing from the scope of the appended claims.

What is claimed is:

1. A magnetic resonance spectroscopic system for receiving a magnetic resonance signal from a localized area in a certain slice in a sample and obtaining a frequency spectrum of the magnetic resonance signal based on the received signal, said system comprising control means for selectively exciting regions sandwiching a zone containing said localized area in one of x- and y-axis directions in said slice, thereafter applying a spoiler to eliminate lateral spin components from said regions, selectively exciting regions sandwiching a zone containing said localized area in the other of x- and y-axis directions in said slice, thereafter applying a spoiler to eliminate lateral spin components from said last-mentioned regions, and then exciting a zone containing said localized area in a $z_y$-axis direction to extract a magnetic resonance signal of said localized area.

2. A magnetic resonance spectroscopic system according to claim 1, wherein said regions are selectively excited by 90° pulses.

3. A magnetic resonance spectroscopic system according to claim 1, wherein said regions are selectively excited in the y-, x-, and y-axis directions in the named order.

4. A magnetic resonance spectroscopic system according to claim 1, wherein said zone is excited in the $z_y$-axis direction by $+G_z$ pulses and thereafter $-G_z$ pulses.

5. A magnetic resonance spectroscopic system according to claim 1, wherein said regions are selectively excited while a plurality of different frequency signals sandwiching the zones containing the localized area are serving as carriers.

* * * * *